United States Patent

Inoue et al.

(10) Patent No.: US 9,578,734 B2
(45) Date of Patent: Feb. 21, 2017

(54) PREPREG, METAL-CLAD LAMINATE, AND PRINTED WIRING BOARD

(71) Applicant: PANASONIC CORPORATION, Osaka (JP)

(72) Inventors: Hiroharu Inoue, Osaka (JP); Koji Kishino, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/355,141

(22) PCT Filed: Sep. 19, 2013

(86) PCT No.: PCT/JP2013/005531
§ 371 (c)(1),
(2) Date: Apr. 29, 2014

(87) PCT Pub. No.: WO2014/050034
PCT Pub. Date: Apr. 3, 2014

(65) Prior Publication Data
US 2014/0367150 A1 Dec. 18, 2014

(30) Foreign Application Priority Data
Sep. 28, 2012 (JP) .................................. 2012-217608

(51) Int. Cl.
H05K 1/02 (2006.01)
C08J 5/24 (2006.01)
B32B 15/14 (2006.01)
H05K 1/03 (2006.01)
C08G 59/62 (2006.01)
C08L 63/00 (2006.01)

(52) U.S. Cl.
CPC ............ *H05K 1/0271* (2013.01); *B32B 15/14* (2013.01); *C08G 59/621* (2013.01); *C08J 5/24* (2013.01); *C08L 63/00* (2013.01); *H05K 1/038* (2013.01); *C08J 2333/02* (2013.01); *C08J 2363/00* (2013.01); *C08J 2433/02* (2013.01); *C08L 2205/02* (2013.01); *Y10T 428/249921* (2015.04); *Y10T 442/20* (2015.04)

(58) Field of Classification Search
CPC .......... H05K 1/0271; H05K 1/038; C08J 5/24; C08J 2433/02; C08J 2363/00; C08J 2333/02; Y10T 428/249921; Y10T 422/204
USPC ................................. 442/117, 175, 180, 232
See application file for complete search history.

(56) References Cited

U.S. PATENT DOCUMENTS

| | | | |
|---|---|---|---|
| 2006/0054589 A1* | 3/2006 | Omori et al. | 216/13 |
| 2006/0210780 A1* | 9/2006 | Nishii | 428/209 |
| 2008/0286562 A1* | 11/2008 | Toyoda et al. | 428/327 |
| 2009/0141472 A1* | 6/2009 | Choi et al. | 428/354 |
| 2010/0193961 A1* | 8/2010 | Konishi et al. | 428/41.7 |
| 2010/0304092 A1* | 12/2010 | Amano et al. | 428/172 |
| 2011/0155430 A1* | 6/2011 | Lee et al. | 174/257 |
| 2011/0194261 A1* | 8/2011 | Tanaka | B32B 17/04 361/748 |
| 2012/0288659 A1* | 11/2012 | Hoshi et al. | 428/172 |

FOREIGN PATENT DOCUMENTS

| | | |
|---|---|---|
| JP | 2006-137942 A | 6/2006 |
| JP | 2007-138152 A | 6/2007 |
| JP | 2008-007756 A | 1/2008 |
| JP | 2008-266513 A | 11/2008 |
| JP | 2010-209140 A | 9/2010 |
| JP | 2011-162615 A | 8/2011 |
| JP | 2011-190430 A | 9/2011 |
| WO | WO 2011083835 A1 * | 7/2011 ............... C09J 7/02 |

OTHER PUBLICATIONS

International Search Report issued in PCT/JP2013/005531, dated Dec. 17, 2013, with English translation.

* cited by examiner

*Primary Examiner* — Jeremy R Pierce
(74) *Attorney, Agent, or Firm* — McDermott Will & Emery LLP

(57) ABSTRACT

The present disclosure relates to a prepreg formed by drying a fabric substrate impregnated with a resin composition by means of heating until the resin composition is in a semi-cured state. The resin composition contains (A) at least one of an epoxy resin having naphthalene skeleton and a phenolic curing agent; and (B) a polymer having structures represented by the following formulae (I) and (II), no unsaturated bond between carbon atoms, an epoxy value ranging from 0.2 to 0.8 ep/kg, and an weight-average molecular weight ranging from 200,000 to 850,000:

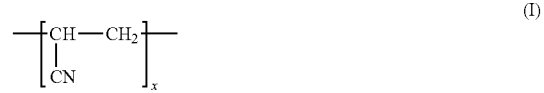

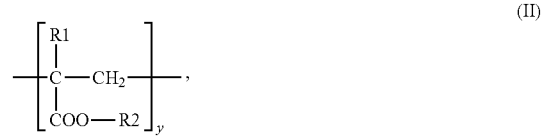

wherein $X:Y=0:1$ to $0.35:0.65$, $R_1$ represents H or $CH_3$, and $R_2$ represents H or an alkyl group.

18 Claims, No Drawings

PREPREG, METAL-CLAD LAMINATE, AND PRINTED WIRING BOARD

RELATED APPLICATIONS

This application is the U.S. National Phase under 35 U.S.C. §371 of International Application No. PCT/JP2013/005531, filed on Sep. 19, 2013, which in turn claims the benefit of Japanese Application No. 2012-217608, filed on Sep. 28, 2012, the disclosures of which Applications are incorporated by reference herein.

TECHNICAL FIELD

The present invention relates to a prepreg, a metal-clad laminate formed of the prepreg, and a printed wiring board formed of the metal-clad laminate.

BACKGROUND ART

In the past, a prepreg has been formed by impregnating a fabric substrate with a resin composition containing thermosetting resin and heating thus-obtained substrate until the resin composition is in a semi-cured state (see, Patent Literatures 1 to 3). Besides, a metal-clad laminate may be formed by disposing metal foil on the prepreg formed in the aforementioned manner, and a printed wiring board may be formed by patterning the metal-clad laminate to make a patterned conductor. Thereafter, a package (PKG) is prepared by mounting a semiconductor element on the printed wiring board and enclosing the element.

Recently, a PoP (Package on Package) has been used for a smartphone and a tablet PC. The PoP includes a plurality of stacked sub-packages. Therefore, mounting performance of the sub-packages and connection reliability between the sub-packages are important. The mounting performance and the connection reliability are improved with a decrease in an absolute value of a warpage of the package (including sub-package) at a room temperature and with a decrease in an amount of change in the warpage caused by a change in the ambient temperature from the room temperature to 260° C. Therefore, substrate material for reducing the warpage of the package has been vigorously developed.

CITATION LIST

Patent Literature

Patent Literature 1: JP 2006-137942 A
Patent Literature 2: JP 2007-138152 A
Patent Literature 3: JP 2008-007756 A

SUMMARY OF INVENTION

Technical Problem

As the substrate material for reducing the warpage of the package, proposed is material which has been developed for the purpose of obtaining high stiffness and a small coefficient of thermal expansion (CTE). In other words, proposed is an approach that the warpage of the package is reduced more with an increase in stiffness and with a decrease in a coefficient of thermal expansion.

It has been confirmed that the material having both high stiffness and a small coefficient of thermal expansion shows an effect of reducing the warpage of the particular form of the package. However, the effect of reducing the warpage is prone to vary depending on difference in a form of the package, unfortunately. This causes a problem of a lack of general versatility. Besides, improving heat resistance of the package has been requested.

In view of the above sufficiency, the present invention has been aimed to propose a prepreg, a metal-clad laminate, and a printed wiring board, which are capable of generally reducing a warpage of a package irrespective of a form of the package and of improving heat resistance of the package.

Solution to Problem

A prepreg in accordance with the present invention is formed by drying a fabric substrate impregnated with a resin composition by means of heating until the resin composition is semi-cured. The resin composition includes (A) at least one of an epoxy resin and a phenolic curing agent both having a naphthalene skeleton and (B) a polymer. The polymer has structures represented by the following formulae (I) and (II), no unsaturated bond between carbon atoms, an epoxy value falling within a range of 0.2 to 0.8 ep/kg, and a weight-average molecular weight falling within a range of 200,000 to 850,000:

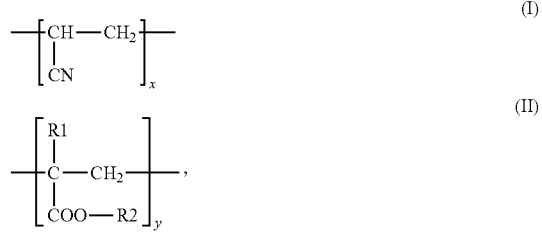

wherein X:Y=0:1 to 0.35:0.65, $R_1$ represents H or $CH_3$, and $R_2$ represents H or an alkyl group.

In the prepreg, the resin composition preferably further contains (C) an inorganic filler.

In the prepreg, a ratio of a loss elastic modulus to a storage elastic modulus in each of temperature ranges of not greater than 60° C. and not less than 200° C. is 0.05 or more when the resin composition is in a fully-cured state.

In the prepreg, a tensile elongation percentage along an oblique direction at 45 degrees to a warp thread or a weft thread of the fabric substrate is 5% or more when the resin composition is in a fully-cured state.

A metal-clad laminate in accordance with the present invention includes the prepreg and metal foil on the prepreg.

A printed wiring board in accordance with the present invention includes the metal-clad laminate formed to have a patterned conductor.

Advantageous Effects of Invention

According to the present invention, it is possible to generally reduce a warpage of a package irrespective of a form of the package and improve heat resistance of the package.

DESCRIPTION OF EMBODIMENTS

Embodiments of the present invention will be described below.

A prepreg in accordance with the present invention is formed by drying a fabric substrate impregnated with a resin composition by means of heating until the resin composition is in a semi-cured state (i.e., a B-stage state).

The resin composition contains the following component (A) and component (B). The resin composition may further contain a component (C) as requested. The components (A) and (B) are not compatible and are phase-separating in the semi-cured state and a cured (fully-cured) state of the resin composition.

The component (A) is matrix resin that serves as a high stiffness component. Specifically, the component (A) contains at least one of epoxy resin having a naphthalene skeleton and a phenolic curing agent having a naphthalene skeleton. Accordingly, the component (A) may contain both of the epoxy resin having a naphthalene skeleton (hereinafter also referred to as "naphthalene-type epoxy resin") and the phenolic curing agent having a naphthalene skeleton (hereinafter also referred to as "naphthalene-type phenolic curing agent"). In another case, the component (A) may contain a combination of epoxy resin having no naphthalene skeleton (hereinafter referred to as "non-naphthalene-type epoxy resin") and the naphthalene-type phenolic curing agent. Furthermore, the component (A) may contain a combination of the naphthalene-type epoxy resin and a phenolic curing agent having no naphthalene skeleton (hereinafter referred to as "non-naphthalene-type phenolic curing agent"). As described above, at least one of the epoxy resin and the phenolic curing agent of the component (A) contains a naphthalene skeleton, and therefore it is possible to improve heat resistance of the resultant package (e.g., solder heat resistance).

The component (B) is a low elastic component and is, specifically, acrylic rubber. The component (B) has a structure represented by the above formulae (I) and (II). Namely, the component (B) has: a main chain containing the structures represented by formulae (I) and (II); and an epoxy group bonded to the main chain. Since X:Y falls within a range of 0:1 to 0.35:0.65 both inclusive, the main chain of the component (B) may consist of the structure represented by the formula (II). Except for this, a sequence of the structures represented by the formulae (I) and (II) is not particularly limited.

The component (B) does not contain an unsaturated bond between carbon atoms such as a double bond and a triple bond. Namely, in the component (B), carbon atoms are bonded via a saturated bond (single bond). If a prepreg containing a component that contains an unsaturated bond between carbon atoms, the prepreg comes to lose elasticity and becomes brittle when oxidized with time.

The component (B) has an epoxy value falling within a range of 0.2 to 0.8 ep/kg. When the epoxy value is smaller than 0.2 ep/kg, the component (B) contains less epoxy groups that react with thermosetting resin of the component (A) (e.g., epoxy resin). Therefore, thermal plasticity of the component (B) becomes dominant, and this causes a drop in heat resistance of the resultant package. In contrast, when the epoxy value is greater than 0.8 ep/kg, the component (A) and the component (B) are compatible, and therefore a glass transition temperature of a resultant laminate (e.g., a metal-clad laminate and a printed wiring board) is lowered. This causes a drop in heat resistance of the resultant package.

The component (B) is a polymer having a weight-average molecular weight falling within a range of 200,000 to 850,000. The weight-average molecular weight of the component (B) smaller than 200,000 causes a drop in chemical resistance of the prepreg. In contrast, the weight-average molecular weight of the component (B) greater than 850,000 causes a drop in formability of the prepreg.

Since the resin composition contains the aforementioned component (B), a cured product of the resin composition is less likely to absorb moisture. Therefore, it is possible to improve moisture resistance of the laminate and to improve insulation reliability of the laminate.

The component (C) is an inorganic filler. The inorganic filler is not particularly limited, but examples of the inorganic filler include spherical silica, barium sulfate, silicon oxide powder, crushed silica, burnt talc, barium titanate, titanium oxide, clay, alumina, mica, boehmite, zinc borate, zinc stannate, other metal oxides and metal hydrates. When the resin composition contains such an inorganic filler, it is possible to improve a dimensional stability of the laminate.

The resin composition may contain a curing accelerator. The curing accelerator is not particularly limited, but examples of the curing accelerator include imidazole, a derivative of imidazole, an organic phosphorus compound, a metal soap (e.g., zinc octoate), a secondary amine, a tertiary amine, and a quaternary ammonium salt.

The resin composition has preferably a mass ratio of the component (A) to the component (B) ranging from 90:10 to 50:50. Besides, in the component (A), an equivalent ratio of the epoxy resin to the phenolic curing agent preferably falls within a range of 0.8:1.2 to 1.2:0.8. Furthermore, when the resin composition contains the component (C), an amount of the component (C) is preferably 80 wt % or less, based on the total amount of the resin composition.

The resin composition may be prepared by blending the component (A) and the component (B), and further blending the component (C) and a curing accelerator into the blend of the components (A) and (B) as requested. Besides, this resin composition can be diluted with a solvent to prepare a varnish of the resin composition. Examples of the solvent include a ketone-type solvent (e.g., acetone, methyl ethyl ketone, and cyclohexanone), an aromatic solvent (e.g., toluene and xylene), and a nitrogen containing solvent (e.g., dimethylformamide).

The fabric substrate is not particularly limited so long as is a fabric (e.g., plain-woven fabric) in which a warp thread and a weft thread are woven so as to be almost perpendicular to each other. Preferred examples of the fabric substrate include a fabric made of inorganic fibers such as glass cloth and a fabric made of organic fibers such as aramid cloth. The fabric substrate preferably has a thickness ranging from 10 to 200 μm.

The prepreg in accordance with the present invention may be formed by impregnating the fabric substrate with the resin composition and heating and drying them until the resin composition is in a semi-cured state.

The prepreg obtained in the aforementioned manner has preferably a ratio of a loss elastic modulus to a storage elastic modulus (loss tangent, namely, tanδ defined as a quotient obtained by dividing a loss elastic modulus by a storage elastic modulus) in each of temperature ranges of less than 60° C. and more than 200° C. that is 0.05 or more when the resin composition is in the cured (fully-cured) state. As described above, since the loss tangent has two peaks, the prepreg may have both features of the high stiffness derived from the component (A) and the low elasticity derived from the component (B). Note that the loss tangent may be measured with a dynamic mechanical analyzer.

Moreover, the prepreg preferably has a tensile elongation percentage along an oblique direction at 45 degrees to a warp thread or a weft thread of the fabric substrate of 5% or more when the resin composition is in the cured state. For measurement of the tensile elongation percentage, usually used is a specimen in which a resin composition of a single prepreg is into the cured state (C-stage state). Besides, available is a specimen in which a plurality of prepregs are stacked so that directions of the warp thread and the weft thread of one of the prepregs are identical to those of another, respectively, and the resin compositions of the prepregs are in the cured state. The measurement of the tensile elongation percentage may be conducted in the following tensile elongation test. First, a length ($L_0$) of a specimen in the oblique direction at 45 degrees to the warp thread or the weft thread is measured before the tensile elongation test. In this regard, the specimen is prepared to have a width of 5 mm in advance. Thereafter, the specimen is elongated in the oblique direction at 45 degrees to the warp thread or the weft thread at a velocity of 5 mm/min with using a tensile elongation tester. The tensile elongation percentage may be calculated with the following equation.

Tensile elongation percentage (%)=$\{(L-L_0)/L_0\}*100$

The tensile elongation percentage obtained in the aforementioned manner of 5% or more makes it possible to reduce the warpage of the package more.

The metal-clad laminate in accordance with the present invention is formed by disposing metal foil on the aforementioned prepreg. In this regard, the metal-clad laminate may be formed by disposing metal foil on one side or both sides of the single prepreg, or by stacking a plurality of prepregs to prepare a laminate and disposing metal foil on one side or both sides of the laminate. The metal foil may be cupper foil or the like. The aforementioned formation may be performed with a multistage vacuum press, a double belt, or the like by application of heat and press.

The printed wiring board in accordance with the present invention includes the metal-clad laminate formed to have a patterned conductor. The patterned conductor may be formed by, for example, a subtractive method or the like.

Thereafter, a semiconductor device is mounted on the aforementioned printed wiring board and enclosed. Consequently, a package such as FBGA (Fine pitch Ball Grid Array) may be prepared. Beside, this package may be used as a sub-package and these sub-packages may be stacked to prepare a package such as PoP (Package on Package). As described above, various forms of packages may be prepared, and the component (A) and the component (B) reduce the warpage and improve the heat resistance of every package. Namely, the stiffness of the package can be improved owing to the component (A) and a stress on the package can be suppressed by an elasticity lowered owing to the component (B), and therefore it is possible to generally reduce the warpage of the package without depending on the form of the package. Besides, the heat resistance of the package can be particularly improved owing to the component (A).

EXAMPLES

The present invention will be specifically described with Examples below.

(Prepreg)

The naphthalene-type epoxy resin of the component (A) was "HP 9500" available from DIC Corporation. The non-naphthalene-type epoxy resin of the component (A) was cresol novolac-type epoxy resin "N673" available from DIC Corporation. The non-naphthalene-type phenolic curing agent of the component (A) was a novolac-type phenolic curing agent "TD2090" available from DIC Corporation. The naphthalene-type phenolic curing agent of the component (A) was "HPC9500" available from DIC Corporation.

The components (B) were the following polymers 1 to 7.

The polymer 1 was acrylic rubber "SG-P3-Mw1" available from Nagase ChemteX Corporation. This polymer 1 has: structures represented by the formulae (I) and (II) wherein $R_1$ represents a hydrogen atom and $R_2$ represents a butyl group and an ethyl group; no unsaturated bond between carbon atoms; an epoxy value of 0.2 ep/kg; and a weight-average molecular weight of 260,000.

The polymer 2 was acrylic rubber "SG-P3LC improve 24" available from Nagase ChemteX Corporation. This polymer 2 has: structures represented by the formulae (I) and (II) wherein $R_1$ represents a hydrogen atom and a methyl group and $R_2$ represents a methyl group, a butyl group, and an ethyl group; no unsaturated bond between carbon atoms; an epoxy value of 0.2 ep/kg; and a weight-average molecular weight of 650,000.

The polymer 3 was acrylic rubber "SG-P3" available from Nagase ChemteX Corporation. This polymer 3 has: structures represented by the formulae (I) and (II) wherein $R_1$ represents a hydrogen atom and $R_2$ represents a butyl group and an ethyl group; no unsaturated bond between carbon atoms; an epoxy value of 0.2 ep/kg; and a weight-average molecular weight of 850,000.

The polymer 4 was acrylic rubber "SG-P3 improve 104" available from Nagase ChemteX Corporation. This polymer 4 has: structures represented by the formulae (I) and (II) wherein $R_1$ represents a hydrogen atom and $R_2$ represents a butyl group and an ethyl group; no unsaturated bond between carbon atoms; an epoxy value of 0.4 ep/kg; and a weight-average molecular weight of 850,000.

The polymer 5 was acrylic rubber "SG-P3 improve 179" available from Nagase ChemteX Corporation. This polymer 5 has: structures represented by the formulae (I) and (II) wherein $R_1$ represents a hydrogen atom and $R_2$ represents a butyl group and an ethyl group; no unsaturated bond between carbon atoms; an epoxy value of 0.7 ep/kg; and a weight-average molecular weight of 850,000.

The polymer 6 was "AC3816N" available from Ganz Chemical Co., Ltd. This polymer 6 is core-shell particles whose shell phases are made of poly(methyl methacrylate) and core phases are made of cross-linked acrylic polymer.

The polymer 7 was SBS (styrene-based thermoplastic elastmer) "TUFPRENE A" available from Asahi Kasei Chemicals Corporation.

The component (C) was spherical silica "SC2500-SEJ" available from Admatechs Company Limited.

The curing accelerator was imidazole "2E4MZ" available from SHIKOKU CHEMICALS CORPORATION.

The fabric substrate was glass cloth "1037" (thickness of 27 μm) available from Asahi Kasei E-materials Corporation.

The component (A), the component (B), the component (C), and the curing accelerator were blended. Blending amounts (parts by mass) thereof are shown in Tables 1 and 2. Besides, the resultant resin composition was diluted with a solvent (methyl ethyl ketone) to prepare a varnish of the resin composition.

Then, the fabric substrate was impregnated with the varnish of the resin composition so that a resultant prepreg has the thickness of 30 μm after the resin composition is semi-cured. Thereafter, the fabric substrate impregnated with the resin composition was dried by heating it at 130° C. for 6 min until the resin composition was in the semi-cured state. Consequently, a prepreg was prepared.

(Metal-Clad Laminate)

Two sheets of the prepreg were stacked to form a laminate, and cupper foil (the thickness of 12 μm) was disposed on each of both sides of the laminate. The resultant laminate was heated at 220° C. for 60 min while pressed at 2.94 MPa (30 kgf/cm²) in vacuo. Consequently, as the metal-clad laminate, prepared was a cupper-clad laminate (CCL).

(Loss Tangent (tan δ))

A sheet of the prepreg was treated such that the resin composition was in the cured state, and then cut into a specimen having dimensions of 50 mm by 5 mm. The loss tangent of the specimen was measured with a dynamic mechanical spectrometer "DMS6100" available from SII NanoTechnology Inc. under a condition of a rate of temperature increase of 5° C./min.

(Tensile Elongation Percentage)

To prepare a specimen, a sheet of the prepreg was subjected to treatment to fully cure the resin composition. The measurement of the tensile elongation percentage was performed in the following tensile elongation test. First, a length ($L_0$) of the specimen in the oblique direction at 45 degrees to the warp thread or the weft thread was measured before the tensile elongation test. In this regard, the specimen was prepared to be 5 mm in width. Thereafter, the specimen was elongated in the oblique direction at 45 degrees to the warp thread or the weft thread at a velocity of 5 mm/min with using a tensile elongation tester ("Autograph AGS-X" available from Shimadzu corporation). A length (L) of the specimen at the moment of rupture was measured. The tensile elongation percentage was calculated with the following equation.

Tensile elongation percentage (%)=$\{(L-L_0)/L_0\}*100$ (PKG Warpage)

To measure a PKG warpage, a simple FC mounting PKG (dimensions of 16 mm by 16 mm) was used. The simple FC mounting PKG was prepared by mounting a flip chip (FC) on a substrate by bonding the flop chip to the substrate with a stiffener ("HCV5313HS" available from Panasonic Corporation). In this regard, the FC was a Si chip with the dimensions of 15.06 mm by 15.06 mm by 0.1 mm carrying 4356 solder balls (height of 80 μm). Note that the aforementioned substrate was prepared by removing the metal foil from the metal-clad laminate.

The warpage of the aforementioned FC mounting PKG was measured with a warpage measurement system ("THERMOIRE PS200" available from AKROMETRIX Co.) based on the shadow moire measurement technique. The PKG warpage was a difference between a maximum warpage and a minimum warpage of warpages measured in a process of heating the FC mounting PKG from 25° C. to 260° C. and then cooling it to 25° C.

(PCT Moisture Absorptivity)

The metal foil was removed from the metal-clad laminate and then thus-obtained laminate was cut into a specimen having dimensions of 50 mm by 50 mm. Thereafter, the specimen was left at a temperature as high as 121° C. and at a humidity as high as 100% RH under 0.23 MPa (2.3 atm) for 6 hours to perform the pressure cooker test (PCT). Subsequently, a moisture absorptivity was calculated by the following equation with using weight ($Z_0$) of the specimen before the test and weight (Z) after the test.

Moisture absorptivity (%)=$\{(Z-Z_0)/Z_0\}*100$ (PCT Solder Heat Resistance)

The specimens having been subjected to the pressure cooker test (PCT) in the aforementioned manner were dipped into a solder bath for 20 seconds at 288° C. Thereafter, appearance of each specimen was observed. The specimen whose appearance had no evidence of damage was rated as "OK" while the specimen whose appearance had a "bump" or the like was rated as "NG".

TABLE 1

|   |   | Ex. 1 | Ex. 2 | Ex. 3 | Ex. 4 | Ex. 5 | Ex. 6 | Ex. 7 |
|---|---|---|---|---|---|---|---|---|
| (A) | Naphthalene-type epoxy resin | 48.06 | 48.06 | 48.06 | 48.06 | 48.06 | 0 | 41.82 |
|   | Cresol novolac-type epoxy resin | 0 | 0 | 0 | 0 | 0 | 40.68 | 0 |
|   | Novolac-type phenolic curing agent | 21.94 | 21.94 | 21.94 | 21.94 | 21.94 | 0 | 0 |
|   | Naphthalene-type phenolic curing agent | 0 | 0 | 0 | 0 | 0 | 29.32 | 28.18 |
| (B) | Polymer 1 (acrylic rubber, Mw; 260,000, 0.2 ep/kg) | 30 | 0 | 0 | 0 | 0 | 30 | 30 |
|   | Polymer 2 (acrylic rubber, Mw; 650,000, 0.2 ep/kg) | 0 | 30 | 0 | 0 | 0 | 0 | 0 |
|   | Polymer 3 (acrylic rubber, Mw; 850,000, 0.2 ep/kg) | 0 | 0 | 30 | 0 | 0 | 0 | 0 |
|   | Polymer 4 (acrylic rubber, Mw; 850,000, 0.4 ep/kg) | 0 | 0 | 0 | 30 | 0 | 0 | 0 |
|   | Polymer 5 (acrylic rubber, Mw; 850,000, 0.7 ep/kg) | 0 | 0 | 0 | 0 | 30 | 0 | 0 |

TABLE 1-continued

|  |  |  |  |  |  |  |  |
|---|---|---|---|---|---|---|---|
| Polymer 6 (core-shell particles) | 0 | 0 | 0 | 0 | 0 | 0 | 0 |
| Polymer 7 (SBS) | 0 | 0 | 0 | 0 | 0 | 0 | 0 |
| Curing accelerator (imidazole) | 0.05 | 0.05 | 0.05 | 0.05 | 0.05 | 0.05 | 0.05 |
| (C) Spherical silica | 100 | 100 | 100 | 100 | 100 | 100 | 100 |
| Sum (parts by mass) | 200.05 | 200.05 | 200.05 | 200.05 | 200.05 | 200.05 | 200.05 |
| Peak temperature (° C.) in regions of tanδ ≥ 0.05 | 43 / 265 | 49 / 266 | 45 / 264 | 42 / 255 | 41 / 258 | 43 / 231 | 44 / 271 |
| Tensile elongation percentage (%) | 7.9 | 8.0 | 7.6 | 7.8 | 5.1 | 7.0 | 6.8 |
| PKG warpage (μm) | 562 | 555 | 583 | 569 | 787 | 627 | 642 |
| PCT moisture absorptivity (%) | 0.39 | 0.29 | 0.38 | 0.50 | 0.58 | 0.40 | 0.36 |
| PCT solder heat resistance | OK | OK | OK | OK | OK | OK | OK |

|  | Ex. 8 | Ex. 9 | Ex. 10 | Com. Ex. 1 | Com. Ex. 2 | Com. Ex. 3 | Com. Ex. 4 |
|---|---|---|---|---|---|---|---|
| (A) Naphthalene-type epoxy resin | 34.33 | 48.06 | 48.06 | 68.66 | 48.06 | 48.06 | 0 |
| Cresol novolac-type epoxy resin | 0 | 0 | 0 | 0 | 0 | 0 | 47.03 |
| Novolac-type phenolic curing agent | 15.67 | 21.94 | 21.94 | 31.34 | 21.94 | 21.94 | 22.97 |
| Naphthalene-type phenolic curing agent | 0 | 0 | 0 | 0 | 0 | 0 | 0 |
| (B) Polymer 1 (acrylic rubber, Mw; 260,000, 0.2 ep/kg) | 50 | 50 | 30 | 0 | 0 | 0 | 30 |
| Polymer 2 (acrylic rubber, Mw; 650,000, 0.2 ep/kg) | 0 | 0 | 0 | 0 | 0 | 0 | 0 |
| Polymer 3 (acrylic rubber, Mw; 850,000, 0.2 ep/kg) | 0 | 0 | 0 | 0 | 0 | 0 | 0 |
| Polymer 4 (acrylic rubber, Mw; 850,000, 0.4 ep/kg) | 0 | 0 | 0 | 0 | 0 | 0 | 0 |
| Polymer 5 (acrylic rubber, Mw; 850,000, 0.7 ep/kg) | 0 | 0 | 0 | 0 | 0 | 0 | 0 |
| Polymer 6 (core-shell particles) | 0 | 0 | 0 | 0 | 30 | 0 | 0 |
| Polymer 7 (SBS) | 0 | 0 | 0 | 0 | 0 | 30 | 0 |
| Curing accelerator (imidazole) | 0.05 | 0.05 | 0.05 | 0.05 | 0.05 | 0.05 | 0.05 |
| (C) Spherical silica | 100 | 200 | 0 | 100 | 100 | 100 | 100 |
| Sum (parts by mass) | 200.05 | 320.05 | 100.05 | 200.05 | 200.05 | 200.05 | 200.05 |
| Peak temperature (° C.) in regions of tanδ ≥ 0.05 | 38 / 263 | 39 / 259 | 43 / 266 | 261 | 260 | 191 | 193 |
| Tensile elongation percentage (%) | 10.1 | 5.6 | 9.9 | 4.5 | 4.3 | 7.5 | 8.1 |
| PKG warpage (μm) | 433 | 741 | 442 | 844 | 864 | 590 | 549 |
| PCT moisture absorptivity (%) | 0.32 | 0.28 | 0.52 | 0.79 | 0.74 | 0.65 | 0.71 |
| PCT solder heat resistance | OK | OK | OK | OK | OK | NG | NG |

As apparently shown in Tables 1 and 2, Examples provide reduced warpages of packages, improved heat resistance, and moisture resistance compared with Comparative Examples.

In contrast, Comparative Examples 1 to 3 in which none of the polymers 1 to 5 is used provide higher moisture absorptivity and therefore provide lower moisture resistance. Besides, Comparative Example 3 in which the polymer 7 is used provides lower heat resistance.

Furthermore, Comparative Example 4 in which neither the epoxy resin nor the phenolic curing agent contains naphthalene skeleton provides higher moisture absorptivity and lower moisture resistance.

The invention claimed is:

1. A prepreg formed by drying a fabric substrate impregnated with a resin composition by means of heating until the resin composition is in a semi-cured state, the resin composition comprising:
(A) an epoxy resin and a phenolic curing agent; and
(B) a polymer having structures represented by the following formulae (I) and (II), no unsaturated bond between carbon atoms, an epoxy value falling within a range of 0.2 to 0.7 ep/kg, and a weight-average molecular weight falling within a range of 260,000 to 850,000:

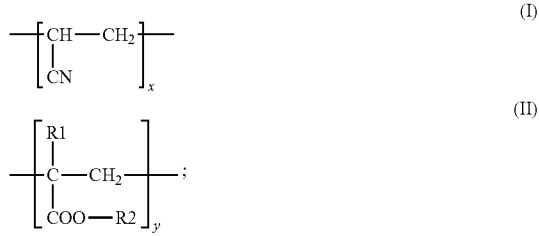

and, wherein:
X:Y=0:1 to 0.35:0.65, $R_1$ represents H or $CH_3$, and $R_2$ represents H, a methyl group, an ethyl group or a butyl group, the fabric substrate is a fabric in which a warp thread and a weft thread are woven so as to be almost perpendicular to each other, at least one of the epoxy resin and the phenolic curing agent has a naphthalene skeleton, and a ratio of a loss elastic modulus to a storage elastic modulus in each of temperature ranges of not greater than 60° C. and not less than 231° C. of the prepreg is 0.05 or more when the resin composition is in a fully-cured state.

2. The prepreg according to claim 1, wherein the resin composition further comprises an inorganic filler as a component (C).

3. The prepreg according to claim 1, wherein the ratio of a loss elastic modulus to a storage elastic modulus in each of temperature ranges of 38 ° C. to 49 ° C. and 231 ° C. to 271 ° C. of the prepreg is 0.05 or more when the resin composition is in a fully-cured state.

4. The prepreg according to claim 1, wherein a tensile elongation percentage along an oblique direction at 45 degrees to the warp thread or the weft thread of the fabric substrate of the prepreg is 5.1% to 10.1% when the resin composition is in a fully-cured state.

5. A metal-clad laminate, comprising:
the prepreg according to claim 1; and
metal foil on the prepreg.

6. A printed wiring board, comprising the metal-clad laminate according to claim 5 being formed to have a patterned conductor.

7. The prepreg according to claim 1, wherein the resin composition comprises 34.33 to 48.06 parts by mass of the epoxy resin based on 100 parts by mass of a total amount of the component (A) and the component (B).

8. The prepreg according to claim 1, wherein the resin composition comprises 15.67 to 29.32 parts by mass of the phenolic curing agent based on 100 parts by mass of a total amount of the component (A) and the component (B).

9. The prepreg according to claim 1, wherein a mass ratio of the component (A) to the component (B) ranges from 70:30 to 50:50.

10. The prepreg according to claim 2, wherein an amount of the component (C) is 62.5 wt% or less, based on a total amount of the resin composition.

11. The prepreg according to claim 2, wherein the component (C) is spherical silica.

12. The prepreg according to claim 1, wherein the resin composition further comprises a curing accelerator.

13. The prepreg according to claim 12, wherein the curing accelerator is a imidazole.

14. The prepreg according to claim 1, wherein the fabric substrate is a glass cloth.

15. The prepreg according to claim 3, wherein:
the ratio of a loss elastic modulus to a storage elastic modulus is a loss tangent, and
the loss tangent has one peak in each of temperature ranges of 38 ° C. to 49 ° C. and 231 ° C. to 271 ° C. when the resin composition is in a fully-cured state.

16. The metal-clad laminate according to claim 5, wherein the metal foil is copper foil.

17. A sub-package comprising:
the printed wiring board according to claim 6; and
a semiconductor device mounted on the printed wiring board and enclosed.

18. A package on package comprising the sub-packages according to claim 17,
wherein the sub-packages are stacked.

* * * * *